(12) United States Patent
Jung et al.

(10) Patent No.: US 7,485,411 B2
(45) Date of Patent: Feb. 3, 2009

(54) METHOD FOR MANUFACTURING PRINTED CIRCUIT BOARD WITH THIN FILM CAPACITOR EMBEDDED THEREIN

(75) Inventors: Hyung Mi Jung, Gyunggi-Do (KR); Yul Kyo Chung, Gyunggi-Do (KR); Hyung Dong Kang, Gyunggi-Do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 29 days.

(21) Appl. No.: 11/700,864

(22) Filed: Feb. 1, 2007

(65) Prior Publication Data
US 2007/0178412 A1 Aug. 2, 2007

(30) Foreign Application Priority Data
Feb. 1, 2006 (KR) ............... 10-2006-0009830

(51) Int. Cl.
*G03C 5/00* (2006.01)
(52) U.S. Cl. .................................. 430/314
(58) Field of Classification Search ................ 430/314
See application file for complete search history.

(56) References Cited

U.S. PATENT DOCUMENTS

| 5,261,153 | A | 11/1993 | Lucas |
| 6,541,137 | B1 | 4/2003 | Kingon et al. |
| 2005/0011857 | A1* | 1/2005 | Borland et al. ............ 216/13 |
| 2007/0004165 | A1* | 1/2007 | Shin et al. ................ 438/393 |
| 2007/0152773 | A1* | 7/2007 | Oakes et al. ............... 333/120 |

* cited by examiner

*Primary Examiner*—Matthew Smith
*Assistant Examiner*—Walter H Swanson
(74) *Attorney, Agent, or Firm*—McDermott Will & Emery LLP

(57) ABSTRACT

In a method for manufacturing a printed circuit board with a thin film capacitor embedded therein, a conductive metal is sputtered via a first mask to form a lower electrode. A dielectric material is sputtered via a second mask to form a dielectric layer. The conductive metal is sputtered via a third mask to form an upper electrode. An insulating layer is stacked on a stack body with the upper electrode formed therein and via holes are perforated from a top surface of the insulating layer to a top surface of the lower electrode and from the top surface of the insulating layer to a top surface of the upper electrode formed on the substrate. Also, the stack body with the via holes formed therein is electrolytically and electrolessly plated.

14 Claims, 8 Drawing Sheets

METHOD FOR MANUFACTURING PRINTED CIRCUIT BOARD WITH THIN FILM CAPACITOR EMBEDDED THEREIN

CLAIM OF PRIORITY

This application claims the benefit of Korean Patent Application No. 2006-09830 filed on Feb. 1, 2006 in the Korean Intellectual Property Office, the disclosure of which is incorporated herein by reference.

BACKGROUND OF THE INVENTION

1. Field of the Invention

The present invention relates to a method for manufacturing a printed circuit board with a thin film capacitor embedded therein, more particularly, in which a metal electrode and dielectric film for a capacitor can be formed by sputtering.

2. Description of the Related Art

A smaller, higher-performing and higher-frequency trend of electronic products has recently led to a technology for embedding passive devices in a printed circuit board (PCB) This technology allows embedding of the passive devices that occupy at least 50% of a surface area of the board. Here, capacitors account for at least 50% of the passive devices. Accordingly, this results in smaller products with more flexibility in design which require less solder joints. This enhances reliability of the products and reduces noises thereof. Also, this shortens a connecting path to lower inductance effectively.

Especially, a decoupling capacitor, when employed, is located in a proximity to integrated circuits to eliminate noises arising from power voltage supply and switching. Here, the decoupling capacitor requires much higher capacitance and lower equivalent series inductance (ESL) due to higher speed IC chips. Furthermore, a low inductance chip capacitor (LICC) with less inductance is adopted for a surface mount device (SMD) to reduce inductance to about 300 pH.

When it comes to an embedded capacitor, typically, an embedded decoupling capacitor is constructed of two Cu foils (conductive layers) and a prepreg type insulating layer therebetween. Here, the embedded capacitor has a low capacitance density of 0.77 $nF/cm^2$ (about 20 $nF/in^2$), thus facing an obstacle in its use (resin type). Meanwhile, in ongoing efforts to develop materials for enhancing capacitance density, fillers are dispersed in a resin of the insulating layer to decrease thickness thereof. Here, the capacitor has a capacitance density of 3.1 $nF/cm^2$ (about 20 $nF/in^2$) (complex material type). However, the embedded decoupling capacitor is yet low in capacitance density per area, accordingly with limited availability.

The conventional embedded capacitor as just described is disclosed in U.S. Pat. Nos. 5,261,153, and 6,541,137. Specifically, the document teaches a method for manufacturing a printed circuit board with a capacitor embedded therein by lamination of conductive foils and uncured dielectric sheets alternating therewith. Moreover, the document discloses a high temperature thin film embedded capacitor using a ferroelectric substance. More specifically, the document proposes a barrier layer for preventing the conductive layer from oxidizing from high temperature heat treatment of 400° C. to 800° C.

But in the conventional embedded capacitor, a thin film is formed on an electrode as an RCC type and crystallized through heat treatment to impart a certain dielectric constant to a capacitor product. Then these materials are employed in a PCB process. However, the materials heat treated at a high temperature of 400° C. to 800° C. cannot be configured on a resin-containing PCB. Besides, the conventional embedded capacitor has a problem with alignment due to oxidization, contraction/dilation of electrodes. Also, other problems are entailed by separate fabrication of the conventional embedded capacitor.

This calls for development of a process in which the printed circuit board having the thin film capacitor embedded therein with sufficient dielectric properties is directly applicable to the PCB process. That is, in this PCB process, the thin film capacitor should be fabricated at a low temperature of 200° C. or less since organic materials of the PCB are susceptible to temperature. Also, a process should be developed to overcome problems, e.g., oxidization or corrosion by enchant, attendant to a typical photolithography or etching process.

Therefore, recent attempts have been made to directly fabricate a thin film capacitor in the PCB process by using a dielectric thin film at a room temperature. However, these attempts are accompanied by many technological problems concerning development of dielectric materials with dielectric properties at a low temperature, patterning of dielectrics, and honing of different materials.

SUMMARY OF THE INVENTION

The present invention has been made to solve the foregoing problems of the prior art and therefore an aspect of the present invention is to provide a method for manufacturing a printed circuit board with a thin film capacitor embedded therein, which is free from bonding problems between different materials in an in-line process and suffers a minimal damage to a dielectric layer during the process.

According to an aspect of the invention, the manufacturing method includes:

sputtering a conductive metal via a first mask on a polymer substrate to form a lower electrode for a capacitor;

sputtering a dielectric material via a second mask on the lower electrode to form a dielectric layer enclosing a portion of the lower electrode and one end thereof;

sputtering the conductive metal via a third mask on the dielectric layer and a portion where the dielectric layer abuts the substrate to form an upper electrode for the capacitor;

stacking an insulating layer on a stack body with the upper electrode formed therein and perforating via holes from a top surface of the insulating layer to a top surface of the lower electrode and from the top surface of the insulating layer to a top surface of the upper electrode formed on the substrate; and electrolytically and electrolessly plating the stack body with the via holes formed therein.

According to another aspect of the invention, the manufacturing method includes:

forming through holes in a predetermined portion of a copper clad laminate and plating the through holes;

stacking a first insulating layer on at least one side of the copper clad laminate, forming via holes in a predetermined portion of the first insulating layer and plating the via holes;

sputtering a conductive metal via a first mask on the first insulating layer to form a lower electrode for a capacitor;

sputtering a dielectric material via a second mask on the lower electrode to form a dielectric layer enclosing a portion of the lower electrode and one end thereof;

sputtering the conductive metal via a third mask on the dielectric layer and a portion where the dielectric layer abuts the first insulating layer to form an upper electrode for the capacitor;

stacking a second insulating layer on a stack body with the upper electrode formed therein and perforating via holes from a top surface of the second insulating layer to a top surface of the lower electrode and from the top surface of the second insulating layer to a top surface of the upper electrode formed on the first insulating layer; and electrolytically and electrolessly plating the stack body with the via holes formed therein.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
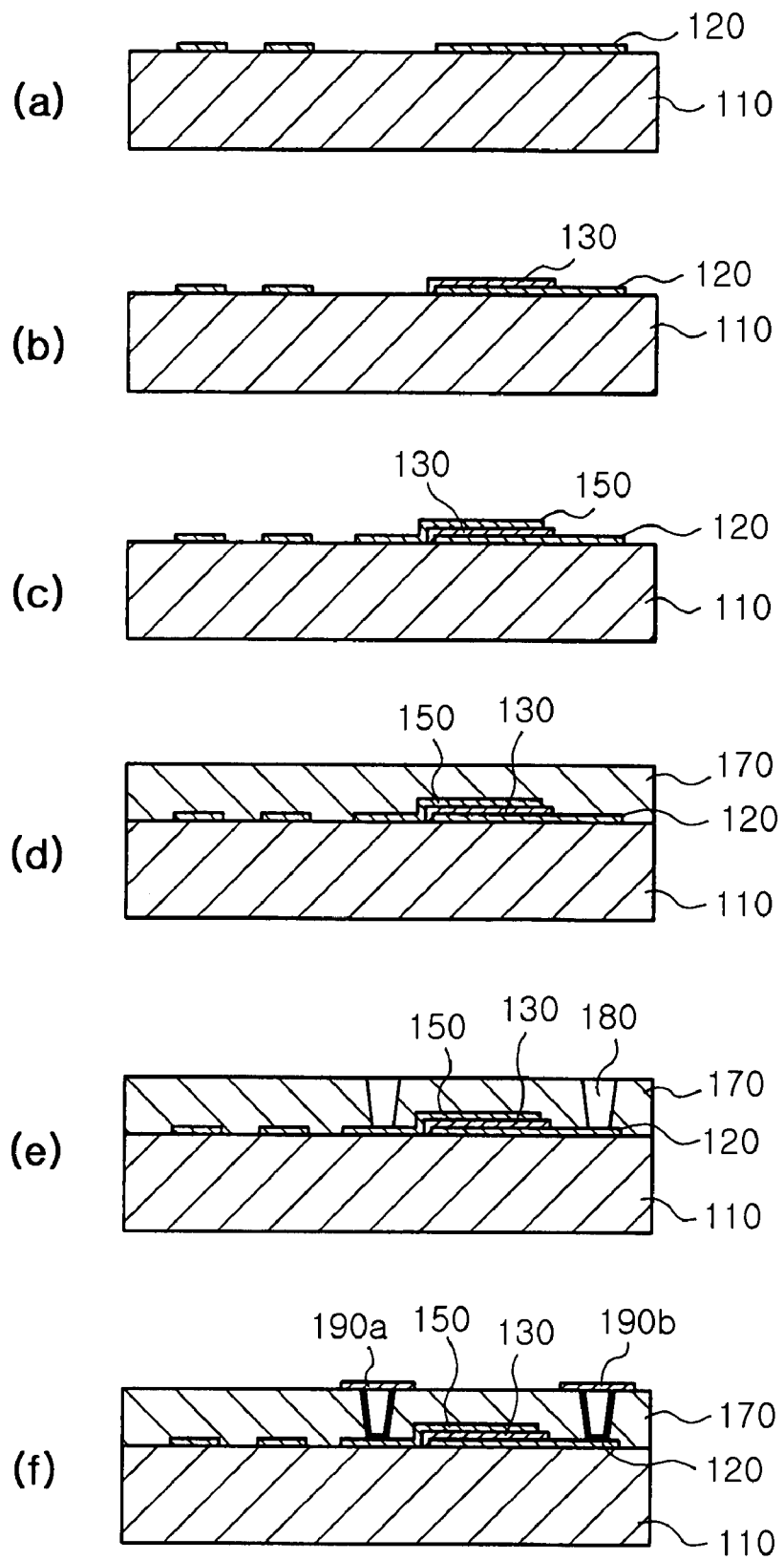
FIG. 1 illustrates a method for manufacturing a printed circuit board with a thin film capacitor embedded therein according to an embodiment of the invention.

FIG. 1 illustrates a method for manufacturing a printed circuit board with a thin film capacitor embedded therein according to an embodiment of the invention.

As shown in FIG. 1(a), according to the invention, first a lower electrode 120 for a capacitor is formed on a polymer substrate 110. Here, to form the lower electrode 120, a conductive metal is sputtered via a first mask at a temperature of 200° C. or less.

The conductive metal for the lower electrode preferably includes one selected from a group consisting of Cu, Ni, Al, Pt, Pd, Ta, Au, and Ag, but the invention is not limited thereto.

More preferably, the lower electrode 120 has a thickness of 100 nm to 500 nm.

Next, according to the invention, as shown in FIG. 1(b), a dielectric material is sputtered via a second mask on the lower electrode 120 at a temperature of 200° C. or less to form a dielectric layer 130 enclosing a portion of the lower electrode and one end thereof. That is, in forming the dielectric layer for the capacitor according to the invention, the dielectric material is sputtered via the second mask to cover a portion of a top surface of the lower electrode 120 and one end thereof. The dielectric layer is not deposited on some other portion of the top surface of the lower electrode 120 as described above in order to facilitate formation of via holes in a later process. Here, the via holes conduct the lower electrode 120 to another external conductive layer (not illustrated). Also, according to the invention, the dielectric layer 130 is deposited to cover the one end of the lower electrode 120. This blocks short circuit between upper and lower electrodes that may occur in forming the upper electrode in a later process.

Meanwhile, desirably, the dielectric layer 130 is a paraelectric film having a dielectric constant at a low temperature of 200° C. Preferably, the dielectric layer 130 is made of an amorphous metal oxide of BiZnNb which has a dielectric constant at a low temperature. More preferably, the dielectric layer 130 is made of a metal oxide having a composition expressed by $Bi_xZn_yNb_zO_7$, where $1.3<x<2.0$, $0.8<y<1.5$, and $1.4<z<1.6$. More preferably, the dielectric layer 130 is made of a metal oxide having a composition expressed by $Bi_2O_3$—$ZnO$—$Nb_2O_5$.

Also, the dielectric layer 130 may be composed of one selected from a group consisting of $TiO_2$, $Bi_2O_3$, $ZnO$, $Nb_2O_5$, $PbO$, $CuO$, and $Ta_2O_5$. Preferably, the dielectric layer 130 has a thickness of 50 nm to 1 μm.

Furthermore, as shown in FIG. 1(c), the conductive metal is sputtered via a third mask on the dielectric layer 130 and a portion where the dielectric layer abuts the substrate 110 to form an upper electrode 150 for the capacitor. That is, the upper electrode 150 is formed not only on a top surface of the dielectric layer 130 but also on the portion where the dielectric layer 130 abuts the substrate 110. This facilitates formation of the via holes in a later process, which electrically conduct the upper electrode 150 to a conductive layer pattern. Here, the conductive metal for the upper electrode has a composition the same as that of the conductive metal for the lower electrode. Also, the upper electrode has a thickness identical to that of the lower electrode.

Afterwards, as shown in FIG. 1(d), an insulating layer 170 such as an Ajinomoto Build-up Film (ABF) is stacked on a stack body with the upper electrode 150 formed therein. Then, as shown in FIG. 1(e), via holes 180 are perforated from a top surface of the insulating layer to a top surface of the lower electrode 120 and from the top surface of the insulating layer to a top surface of the upper electrode 150 formed on the substrate 110. The via holes 180 can be mechanically machined or by a $CO_2$ laser.

Subsequently, according to the invention, as shown in FIG. 1(f), the stack body with the via holes 180 formed in the insulating layer 170 thereof is electrolessly plated, and a dry film is applied thereon. Then metal conductive patterns 190a and 190b are formed on the insulating layer 170 by patterning, electrolytic plating and flash etching. This produces a printed circuit board 100 (not shown) with a thin film capacitor embedded therein. In the meantime, the via holes 180 are rendered conductive by such electrolytic and electroless plating so that the lower electrode 120 is connected to the metal conductive layer pattern 190b and the upper electrode 150 is connected to the metal conductive layer pattern 190a.

FIG. 2 is a schematic view illustrating a method for manufacturing a printed circuit board according to another embodiment of the invention.

Figure 2A:
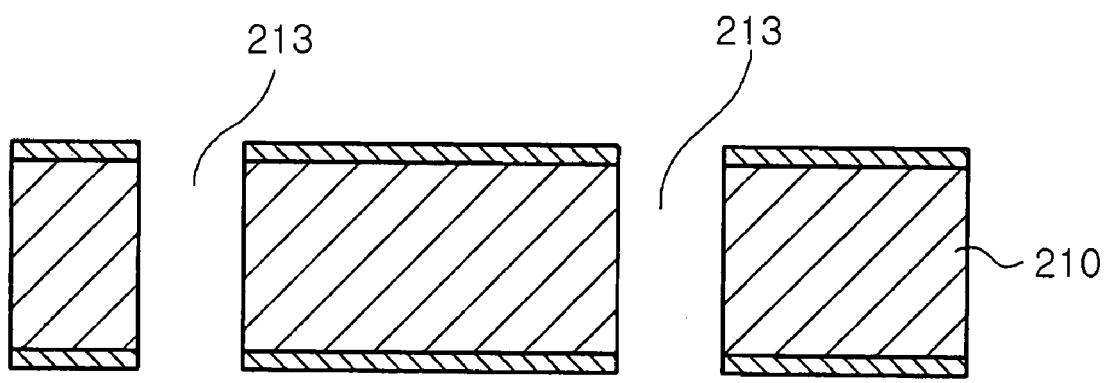
FIGS. 2a to 2h illustrate a method for manufacturing a printed circuit board with a thin film capacitor embedded therein according to another embodiment of the invention.

As shown in FIG. 2(a), according to the invention, first, through holes 213 are formed in a predetermined portion of a copper clad laminate (CCL) 213 and plated. That is, a dry film is applied on a surface of the CCL 210 to form a pattern, and then mechanically machined to form the through holes. Subsequently, the CCL 210 with the through holes formed therein is electrolessly and electrolytically plated to plate the through holes 213.

Figure 2B:
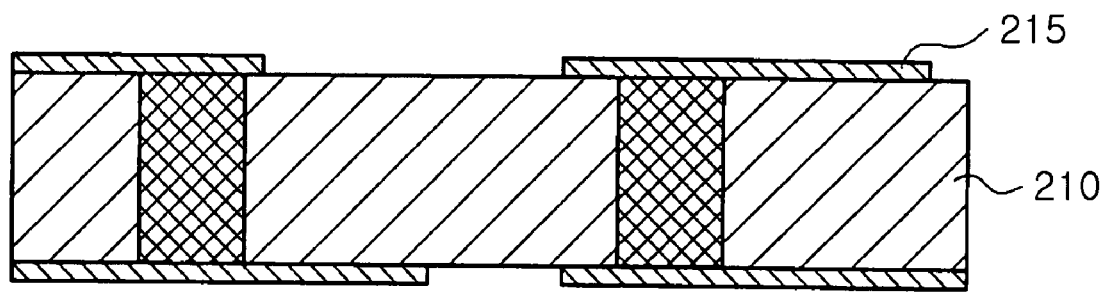

Also, optionally, as shown in FIG. 2(b), a copper foil 215 with a predetermined pattern may be formed on the CCL 210. To obtain the copper foil 215, the CCL 210 can be etched by general photolithography.

Figure 2C:
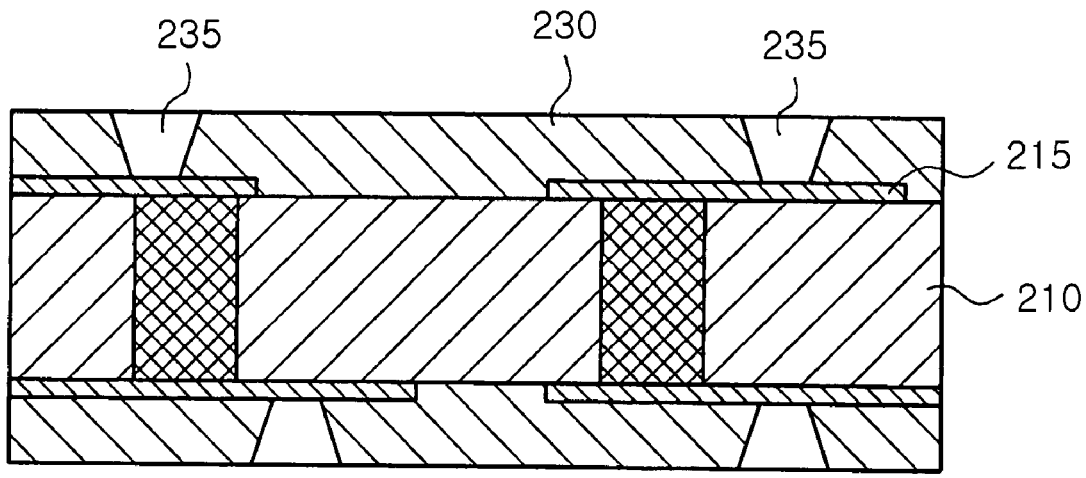

Next, as shown in FIG. 2(c), a first insulating layer 230 such as an ABF is stacked on at least one surface of the CCL having the plated through holes formed therein. Then via holes 235 are formed in a predetermined portion of the first insulating layer 230 and plated. A metal layer is disposed on the via holes and the insulating layer, and a dry film is applied thereon to form a pattern. Then etching is performed in order to pattern the metal layer.

Figure 2D:
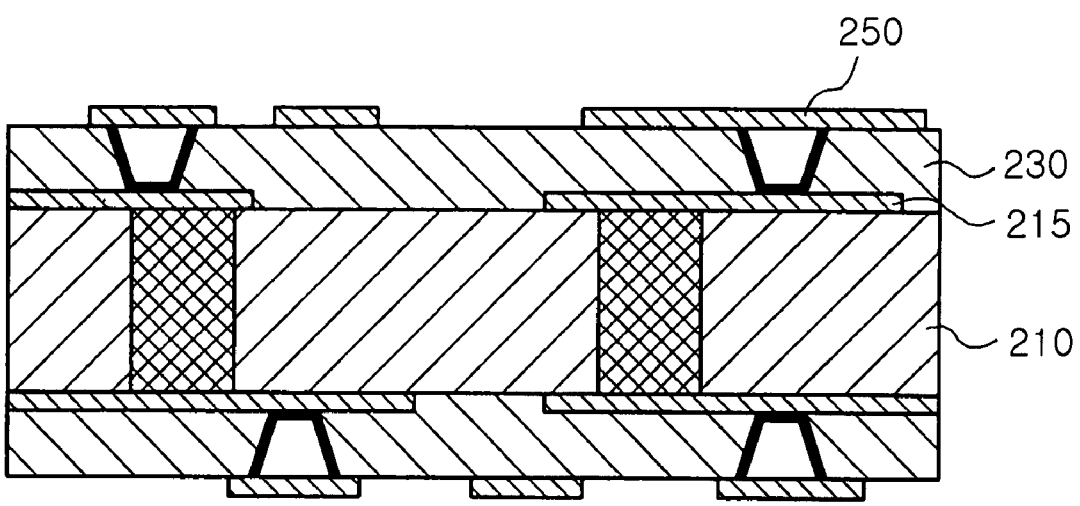

Thereafter, as shown in FIG. 2(d), the conductive metal is sputtered via a first mask on the insulating layer with the plated via hole formed therein to form a lower electrode 250 for a capacitor. Here, according to the invention, the conductive metal is sputtered via the first mask at a temperature of 200° C. or less to form the lower electrode. The lower electrode 250 is preferably made of one selected from a group consisting of Cu, Ni, Al, Pt, Pd, Ta, Au, Ag, but the invention is not limited thereto.

More preferably, the lower electrode 250 has a thickness of 100 nm to 500 nm.

Figure 2E:
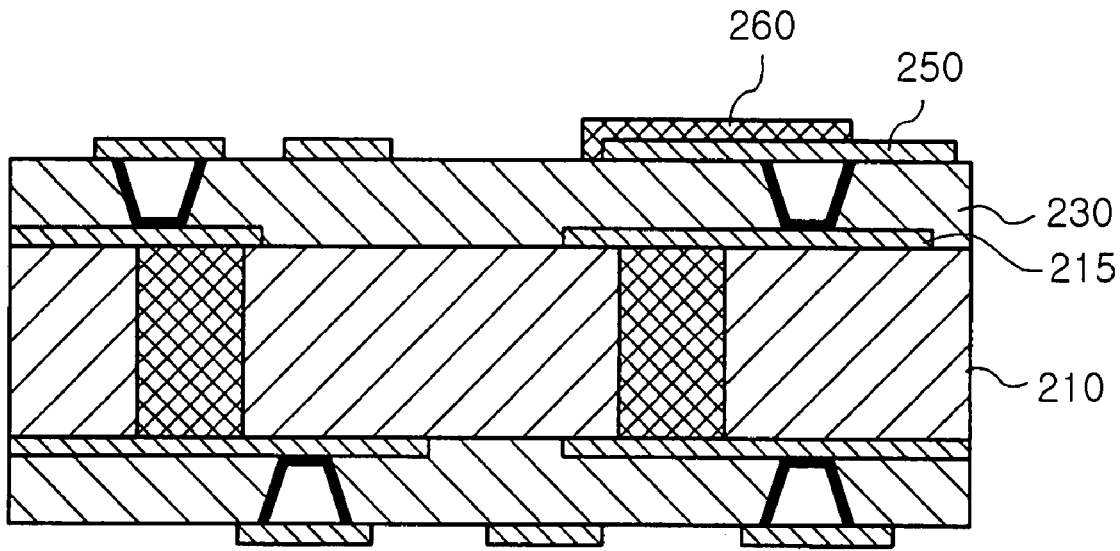

Next, according to the invention, as shown in FIG. 2(e), a dielectric material is sputtered via a second mask on the lower electrode 250 at a temperature of 200° C. or less to form a dielectric layer 260 enclosing a portion of the lower electrode and one end thereof. That is, in forming the dielectric layer for the capacitor, the dielectric material is sputtered via the second mask to cover a portion of a top surface of the lower electrode 250 and one end thereof for detailed reasons described above.

In this invention, the dielectric layer 260 preferably is made of an amorphous metal oxide of BiZnNb which has a dielectric constant at a low temperature. More preferably, the dielectric layer 260 is made of a metal oxide having a composition expressed by $Bi_xZn_yNb_zO_7$, where $1.3<x<2.0$, $0.8<y<1.5$, and $1.4<z<1.6$. More preferably, the dielectric layer 260 is made of a metal oxide having a composition expressed by $Bi_2O_3$—$ZnO$—$Nb_2O_5$. Also, the dielectric layer 260 may be composed of one selected from a group consisting of $TiO_2$, $Bi_2O_3$, $ZnO$, $Nb_2O_5$, $PbO$, $CuO$, and $Ta_2O_5$. The dielectric layer 260 preferably has a thickness of 50 nm to 1 μm.

Figure 2F:
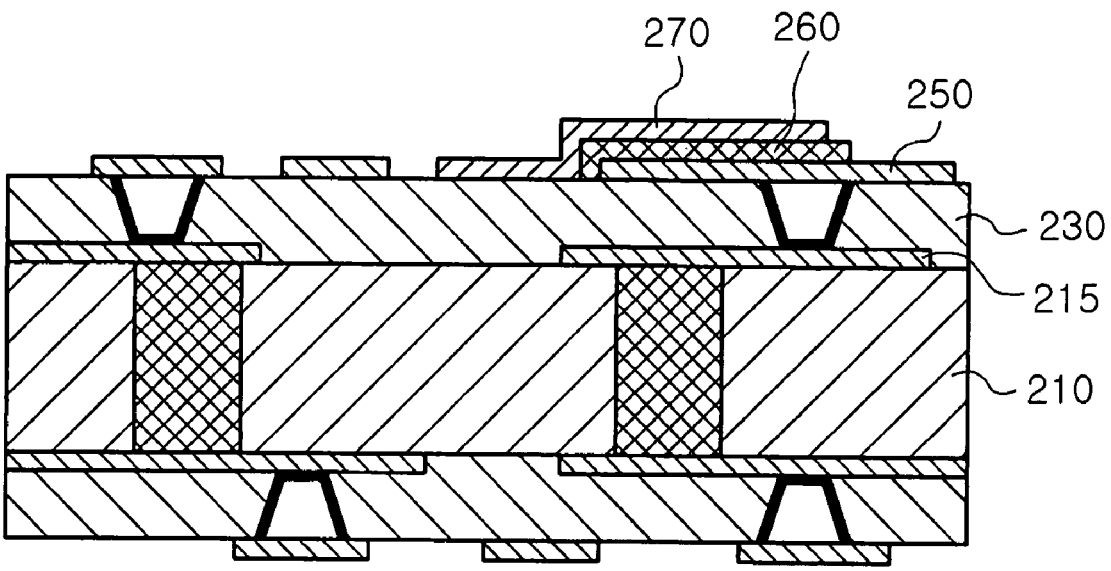

Moreover, according to the invention, as shown in FIG. 2(f), the conductive metal is sputtered via a third mask on the dielectric layer 260 and a portion where the dielectric layer abuts the first insulating layer 230 to form an upper electrode 270 for the capacitor. That is, according to the invention, the upper electrode 270 is formed not only on a top surface of the dielectric layer 260 but also on the portion where the dielectric layer abuts the first insulating layer 230. This facilitates formation of via holes in a later process, which serve to conduct the upper electrode 270 to a conductive layer pattern. Here, the conductive metal for the upper electrode has a composition the same as that of the conductive metal for the lower electrode. The upper electrode has a thickness identical to that of the lower electrode.

Figure 2G:
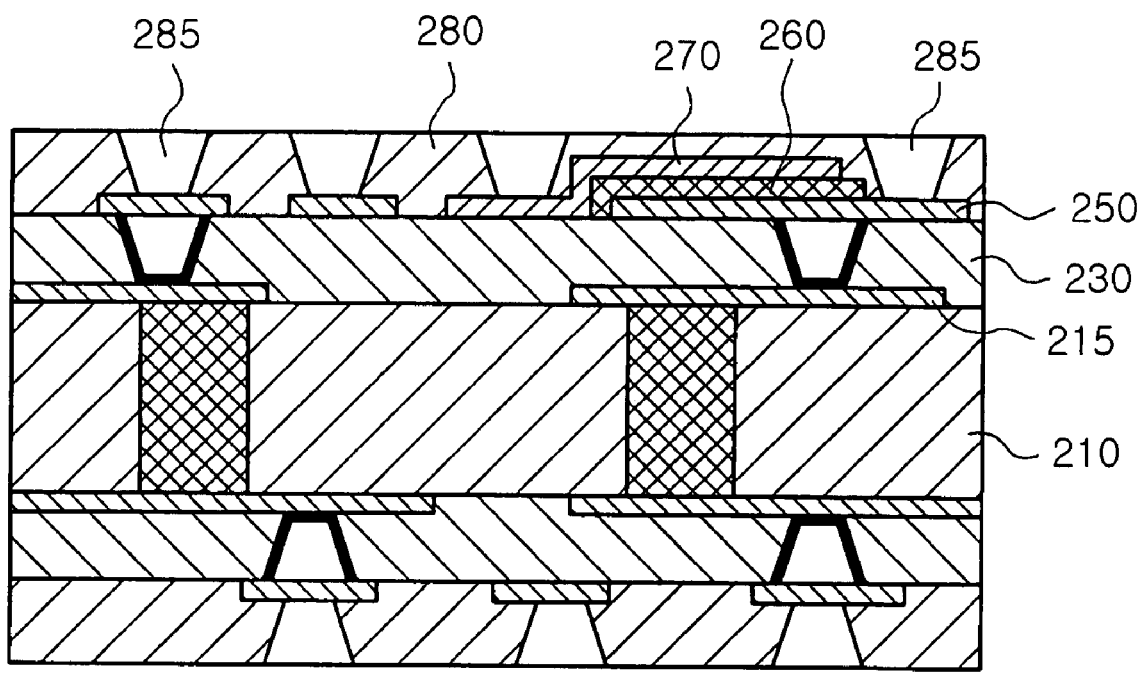

Subsequently, as shown in FIG. 2(g), a second insulating layer 280 is stacked on a stack body with the upper electrode 270 formed therein. Then via holes 285 are perforated from a top surface of the first insulating layer 230 to a top surface of the lower electrode and from the top surface of the first insulating layer 230 to a top surface of the upper electrode 270 formed on the first insulating layer 230. The via holes 285 can be mechanically machined or by a $CO_2$ laser.

Figure 2H:
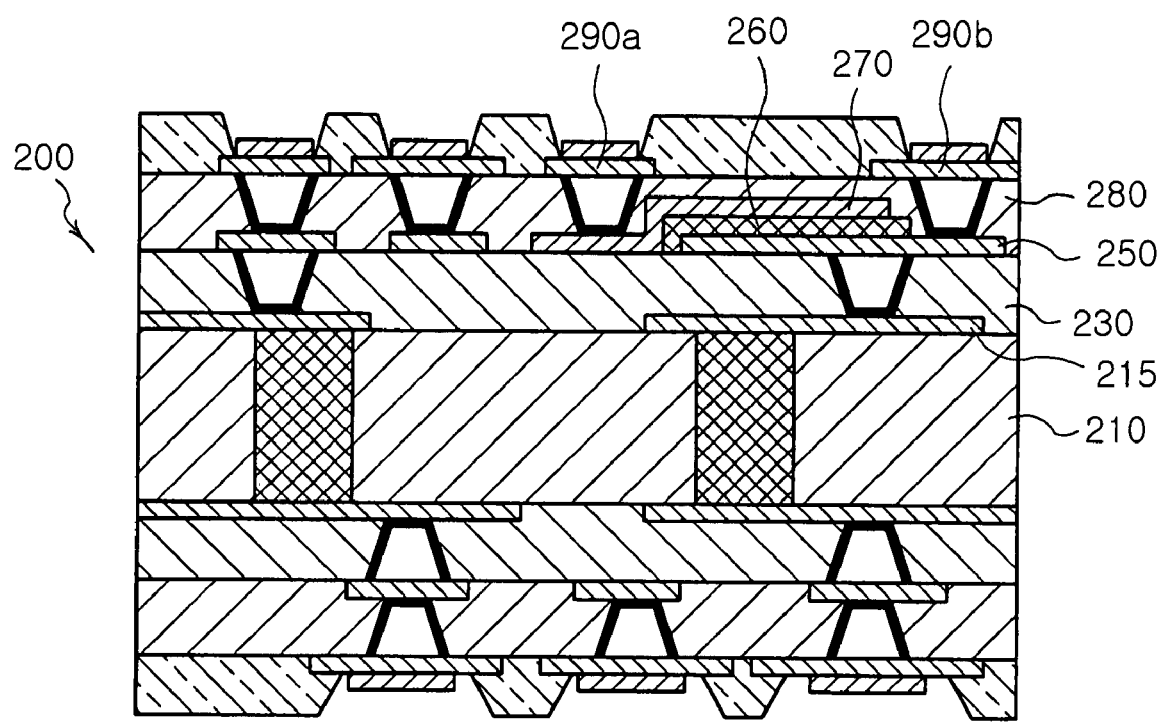

Next, as shown in FIG. 2(h), the stack body with the via holes 285 (not shown) formed in the second insulating layer 280 (not shown) thereof is electrolessly plated and a dry film is applied thereon. Then, metal conductive patterns 290a and 290b are formed on the second insulating layer 280 by patterning, electrolytic plating and flash etching. Here, such electroless and electrolytic plating renders the via holes 285 conductive so that the lower electrode 250 is connected to the metal conductive layer pattern 290b and the upper electrode 270 is connected to the metal conductive layer pattern 290a.

Afterwards, gold is plated on an outer metal pad and solder resist (SR) is also coated thereon to produce a printed circuit board 200 with a thin film capacitor embedded therein.

As described above, according to the invention, sputtering is performed on an organic substrate at a temperature of 200° C. or less in the PCB process. That is, the same process without photolithography or etching is employed to form the lower electrode for the capacitor, the dielectric layer and the upper electrode. This effectively overcomes a problem of bonding strength arising from contamination and impurities in the conventional process.

The invention will be explained in detail through preferred embodiments that will follow.

EXAMPLE

A CCl having copper foils attached on both surfaces thereof was prepared. A dry film was applied on the surfaces of the CCL to form a pattern. Then, through holes were perforated in a predetermined portion of the CCL and then electrolessly and electrolytically plated. Subsequently, an insulating layer made of an Ajinomoto Build-up Film (ABF) was disposed on both surfaces of a stack body with the plated through holes formed therein, and via holes were formed in the insulating layer via $CO_2$ laser. Thereafter, the via holes were electrolessly and electrolytically plated. Cu was sputtered via a mask on the insulating layer to form a lower electrode for a capacitor. Next, a BZN-based dielectric layer and a Cu upper electrode were formed by sputtering. Here, Cu was deposited to a thickness of 500 nm for an hour at a room temperature and at a base pressure of 10-6 Torr. The BZN dielectric layer had a thickness of 300 nm.

Then the ABF was stacked on the stack body with the upper electrode formed therein and via holes were perforated therein. Subsequently, a metal layer was formed on the via holes and the stack body through electroless and electrolytic plating. A dry film was applied on the metal layer to form a pattern, and etched to pattern a metal layer. Afterwards, Au coating was performed on an exposed portion of the metal layer and solder resist (SR) coating was performed on the insulating layer to produce a printed circuit board.

Measurement was taken on electrical properties of the thin film capacitor embedded in the substrate manufactured as described above and the results are shown in FIGS. 3 and 4.

Figure 3:
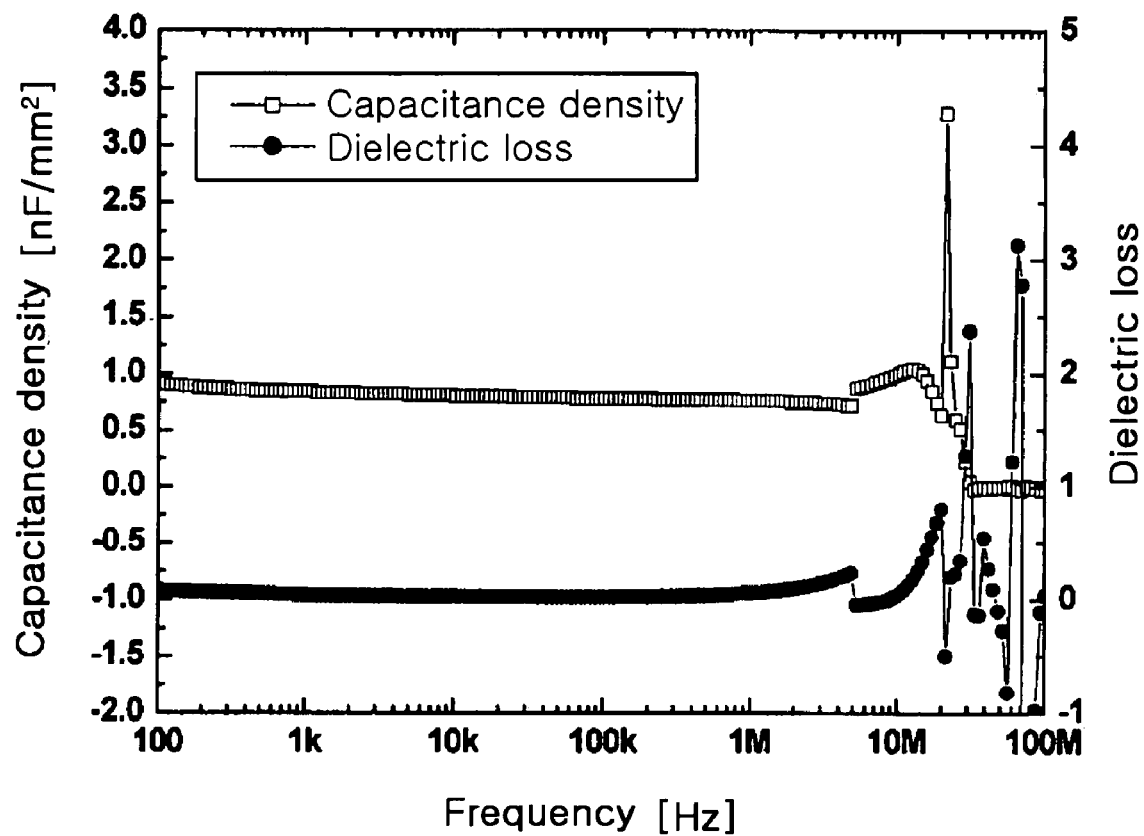
FIG. 3 is a graph illustrating capacitance density and loss in accordance with a frequency of a capacitor manufactured according to the invention.
Figure 4:
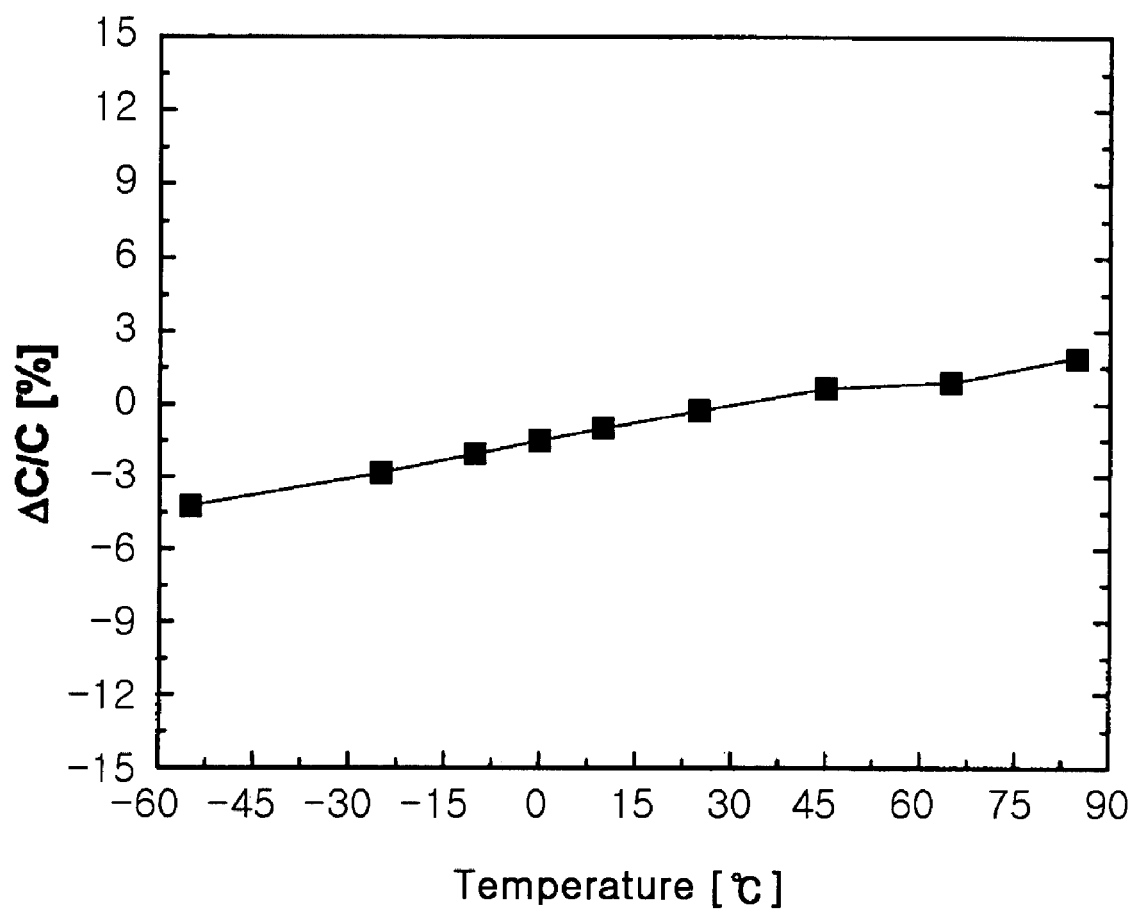
FIG. 4 is a graph illustrating change in capacitance density in accordance with change in temperature of a capacitor manufactured according to the invention.

FIG. 3 is a graph illustrating capacitance density and loss in accordance with a frequency of a capacitor manufactured according to the invention. FIG. 4 is a graph illustrating change in capacitance density in accordance with change in temperature of a capacitor manufactured according to the invention.

The capacitor manufactured according to the invention exhibited capacitance tolerance of ±5% at a temperature of −125° C. to 55° C., referring to FIG. 4. Especially, capacitance tolerance was plotted at ±5% at a temperature of −60° C. to 90° C. This confirms superior properties of the capacitor of the invention.

As set forth above, according to exemplary embodiments of the invention, a lower electrode, dielectric layer and upper electrode for a capacitor are formed by sputtering in a PCB in-line process. This eliminates surface roughness or cleaning problems that may occur in forming a lower electrode according to the conventional plating process. Moreover, the invention does not employ photolithography or etching, thereby minimizing damage to a dielectric film. In addition, the invention produces a capacitor without a separate patterning process, thereby effectively solving a problem of weak bonding strength between different interfaces caused by impurities.

While the present invention has been shown and described in connection with the preferred embodiments, it will be apparent to those skilled in the art that modifications and variations can be made without departing from the spirit and scope of the invention as defined by the appended claims.

What is claimed is:

1. A method for manufacturing a printed circuit board with a thin film capacitor embedded therein, the method comprising:

sputtering a conductive metal via a first mask on a polymer substrate to form a lower electrode for a capacitor;

sputtering a dielectric material via a second mask on the lower electrode to form a dielectric layer enclosing a portion of the lower electrode and one end thereof;

sputtering the conductive metal via a third mask on the dielectric layer and a portion where the dielectric layer abuts the substrate to form an upper electrode for the capacitor;

stacking an insulating layer on a stack body with the upper electrode formed therein and perforating via holes from a top surface of the insulating layer to a top surface of the lower electrode and from the top surface of the insulating layer to a top surface of the upper electrode formed on the substrate; and electrolytically and electrolessly plating the stack body with the via holes formed therein.

2. The method according to claim 1, wherein the lower and upper electrodes comprise one selected from a group consisting of Cu, Ni, Al, Pt, Pd, Ta, Au, and Ag.

3. The method according to claim 1, wherein each of the lower and upper electrodes has a thickness of 100 nm to 500 nm.

4. The method according to claim 1, wherein the dielectric layer comprises an amorphous metal oxide of BiZnNb.

5. The method according to claim 4, wherein the dielectric layer comprises a metal oxide having a composition expressed by $Bi_xZn_yNb_zO_7$, where $1.3<x<2.0$, $0.8<y<1.5$, and $1.4<z<1.6$.

6. The method according to claim 5, wherein the dielectric layer comprises a metal oxide having a composition expressed by $Bi_2O_3$—$ZnO$—$Nb_2O_5$.

7. The method according to claim 1, wherein the dielectric layer has a thickness of 50 nm to 1 μm.

8. A method for manufacturing a printed circuit board with a thin film capacitor embedded therein, the method comprising:

forming through holes in a predetermined portion of a copper clad laminate and plating the through holes;

stacking a first insulating layer on at least one side of the copper clad laminate, forming via holes in a predetermined portion of the first insulating layer and plating the via holes;

sputtering a conductive metal via a first mask on the first insulating layer to form a lower electrode for a capacitor;

sputtering a dielectric material via a second mask on the lower electrode to form a dielectric layer enclosing a portion of the lower electrode and one end thereof;

sputtering the conductive metal via a third mask on the dielectric layer and a portion where the dielectric layer abuts the first insulating layer to form an upper electrode for the capacitor;

stacking a second insulating layer on a stack body with the upper electrode formed therein and perforating via holes from a top surface of the second insulating layer to a top surface of the lower electrode and from the top surface of the second insulating layer to a top surface of the upper electrode formed on the first insulating layer; and electrolytically and electrolessly plating the stack body with the via holes formed therein.

9. The method according to claim 8, wherein the lower and upper electrodes comprise one selected from a group consisting of Cu, Ni, Al, Pt, Pd, Ta, Au, and Ag.

10. The method according to claim 8, wherein each of the lower and upper electrodes has a thickness of 100 nm to 500 nm.

11. The method according to claim 8, wherein the dielectric layer comprises an amorphous metal oxide of BiZnNb.

12. The method according to claim 11, wherein the dielectric layer comprises a metal oxide having a composition expressed by $Bi_xZn_yNb_zO_7$, where $1.3<x<2.0$, $0.8<y<1.5$, and $1.4<z<1.6$.

13. The method according to claim 12, wherein the dielectric layer comprises a metal oxide having a composition expressed by $Bi_2O_3$—$ZnO$—$Nb_2O_5$.

14. The method according to claim 8, wherein the dielectric layer has a thickness of 50 nm to 1 μm.

* * * * *